(12) United States Patent
Park et al.

(10) Patent No.: US 10,256,324 B2
(45) Date of Patent: Apr. 9, 2019

(54) SEMICONDUCTOR DEVICES HAVING VERTICAL TRANSISTORS WITH ALIGNED GATE ELECTRODES

(71) Applicant: Samsung Electronics Co., Ltd., Suwon-si, Gyeonggi-do (KR)

(72) Inventors: Sungil Park, Suwon-si (KR); Changhee Kim, Suwon-si (KR); Yunil Lee, Anyang-si (KR); Mirco Cantoro, Suwon-si (KR); Junggun You, Ansan-si (KR); Donghun Lee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/664,226

(22) Filed: Jul. 31, 2017

(65) Prior Publication Data

US 2018/0248018 A1    Aug. 30, 2018

(30) Foreign Application Priority Data

Feb. 24, 2017 (KR) .................. 10-2017-0024948

(51) Int. Cl.
| | |
|---|---|
| *H01L 29/66* | (2006.01) |
| *H01L 29/78* | (2006.01) |
| *H01L 29/06* | (2006.01) |
| *H01L 29/08* | (2006.01) |
| *H01L 29/10* | (2006.01) |
| *H01L 21/28* | (2006.01) |

(Continued)

(52) U.S. Cl.
CPC .. *H01L 29/66666* (2013.01); *H01L 21/28114* (2013.01); *H01L 29/0653* (2013.01); *H01L 29/0847* (2013.01); *H01L 29/1033* (2013.01); *H01L 29/401* (2013.01); *H01L 29/66553* (2013.01); *H01L 29/7827* (2013.01); *H01L 29/4238* (2013.01)

(58) Field of Classification Search
CPC .......... H01L 29/66666; H01L 29/0847; H01L 29/1033; H01L 29/401; H01L 21/28114; H01L 29/0653; H01L 29/66553; H01L 29/7827; H01L 29/4238
See application file for complete search history.

(56) References Cited

U.S. PATENT DOCUMENTS 7,615,817 B2 * 11/2009 Moon ............... H01L 27/10876
257/302
7,892,912 B2    2/2011 Kim
(Continued)

FOREIGN PATENT DOCUMENTS

JP    2014-135359 A    7/2014
KR    10-0971411 B1    7/2010

*Primary Examiner* — Victor A Mandala
(74) *Attorney, Agent, or Firm* — Sughrue Mion, PLLC

(57) ABSTRACT

A semiconductor device includes an active pillar on a substrate. A first source/drain region is disposed at a top end of the active pillar and has a greater width than the active pillar. A first insulating layer is disposed on a sidewall of the active pillar and a second insulating layer is disposed on at least a bottom surface of the first source/drain region. A gate electrode is disposed on the first insulating layer and the second insulating layer. A second source/drain region is disposed in the substrate at a bottom end of the active pillar. Methods of fabrication are also described.

14 Claims, 18 Drawing Sheets

(51) Int. Cl.
*H01L 29/40* (2006.01)
*H01L 29/423* (2006.01)

(56) References Cited

U.S. PATENT DOCUMENTS

| | | | |
|---|---|---|---|
| 8,647,947 B2 | 2/2014 | Masuoka et al. | |
| 8,969,963 B2 * | 3/2015 | Basker | H01L 29/785 |
| | | | 257/347 |
| 9,349,860 B1 | 5/2016 | Afzalian et al. | |
| 9,406,793 B2 * | 8/2016 | Zhao | H01L 29/781 |
| 2007/0148939 A1 | 6/2007 | Chu et al. | |
| 2013/0273703 A1 | 10/2013 | Masuoka et al. | |
| 2013/0313525 A1 | 11/2013 | Rosaz et al. | |
| 2015/0228775 A1 * | 8/2015 | Yu | H01L 29/66666 |
| | | | 257/329 |
| 2015/0364560 A1 * | 12/2015 | Wang | H01L 29/42392 |
| | | | 257/288 |
| 2015/0380548 A1 * | 12/2015 | Wang | H01L 29/7827 |
| | | | 257/329 |
| 2016/0064541 A1 * | 3/2016 | Diaz | H01L 29/66666 |
| | | | 257/329 |
| 2016/0079239 A1 * | 3/2016 | Wang | H01L 21/823487 |
| | | | 257/328 |
| 2016/0211368 A1 * | 7/2016 | Chen | H01L 29/7827 |
| 2016/0336324 A1 * | 11/2016 | Li | H01L 27/0928 |
| 2018/0083136 A1 * | 3/2018 | Xie | H01L 29/7827 |

\* cited by examiner

SEMICONDUCTOR DEVICES HAVING VERTICAL TRANSISTORS WITH ALIGNED GATE ELECTRODES

CROSS-REFERENCE TO RELATED APPLICATION

This U.S. non-provisional patent application claims priority under 35 U.S.C. § 119 to Korean Patent Application No. 10-2017-0024948, filed on Feb. 24, 2017, in the Korean Intellectual Property Office, the disclosure of which is hereby incorporated by reference in its entirety.

BACKGROUND

Embodiments of the inventive concepts relate to semiconductor devices and methods of fabricating the same.

Semiconductor devices are widely used in an electronic industry because of their small sizes, multi-functional characteristics, and/or low manufacturing costs. Semiconductor devices may be categorized as any one of semiconductor memory devices storing logical data, semiconductor logic devices processing logical data, and hybrid semiconductor devices having both the function of the semiconductor memory devices and the function of the semiconductor logic devices.

Because of ongoing demand for high-speed and/or low-voltage semiconductor devices, semiconductor devices have been highly integrated to meet these demands. Reliability of semiconductor devices may be degraded by high integration density. However, high reliability is generally desired for semiconductor devices. Therefore, research for new techniques for improving reliability of semiconductor devices continues.

SUMMARY

Embodiments of the inventive concepts may provide vertical field effect transistors having threshold voltages with improved uniformity.

Embodiments of the inventive concepts may also provide methods of fabricating a semiconductor device with reduced variance of transistor gate lengths (e.g., effective gate lengths).

In some embodiments, a semiconductor device includes an active pillar on a substrate. A first source/drain region is disposed at a top end of the active pillar and has a greater width than the active pillar. A first insulating layer is disposed on a sidewall of the active pillar and a second insulating layer is disposed on at least a bottom surface of the first source/drain region. A gate electrode is disposed on the first insulating layer and the second insulating layer. A second source/drain region is disposed in the substrate at a bottom end of the active pillar.

In further embodiments, methods of fabricating a semiconductor device include forming an active pillar protruding from a surface of a semiconductor, forming a first source/drain region in the semiconductor substrate at a bottom end of the active pillar, and forming a first insulating layer covering the active pillar. A portion of the first insulating layer is removed to expose an upper portion of the active pillar and a second source/drain region is formed on the exposed upper portion of the active pillar, the second source/drain region having a greater width than the active pillar and spaced apart from the first insulating layer. A second insulating layer is formed on a sidewall and a bottom surface of the second source/drain region. A portion of the first insulating layer is removed to expose a bottom surface of the second insulating layer and a portion of a sidewall of the active pillar. A gate electrode is formed on the bottom surface of the second insulating layer and on the sidewall of the active pillar.

In still further embodiments, a semiconductor device includes a semiconductor pillar and a source/drain region adjoining an end of the semiconductor pillar and having a width greater than a width of the semiconductor pillar. A first insulating layer is disposed on a sidewall of the semiconductor pillar and a second insulating layer is disposed on a surface of the second source/drain region adjacent the sidewall of the semiconductor pillar. A gate electrode is disposed on the first and second insulating layers.

BRIEF DESCRIPTION OF THE DRAWINGS

The inventive concepts will become more apparent in view of the attached drawings and accompanying detailed description.

DETAILED DESCRIPTION

Hereinafter, embodiments of the inventive concepts will be described in more detail with reference to the accompanying drawings.

Figure 1:
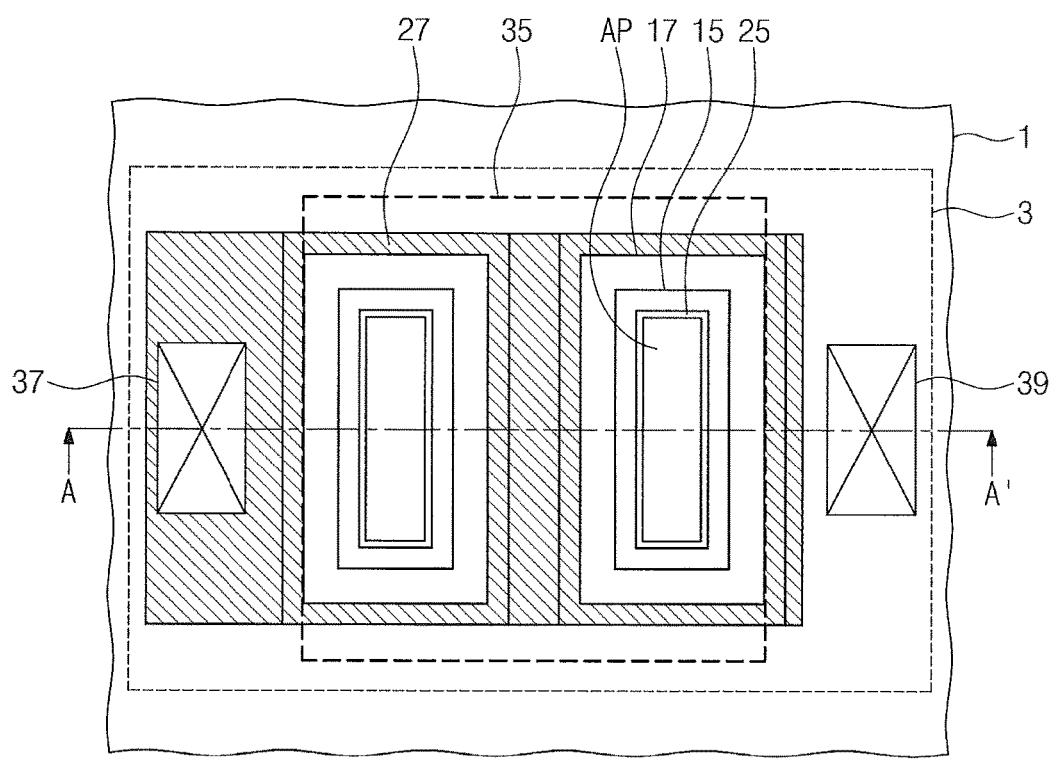
FIG. 1 is a plan view illustrating a semiconductor device according to some embodiments of the inventive concepts.
Figure 2:
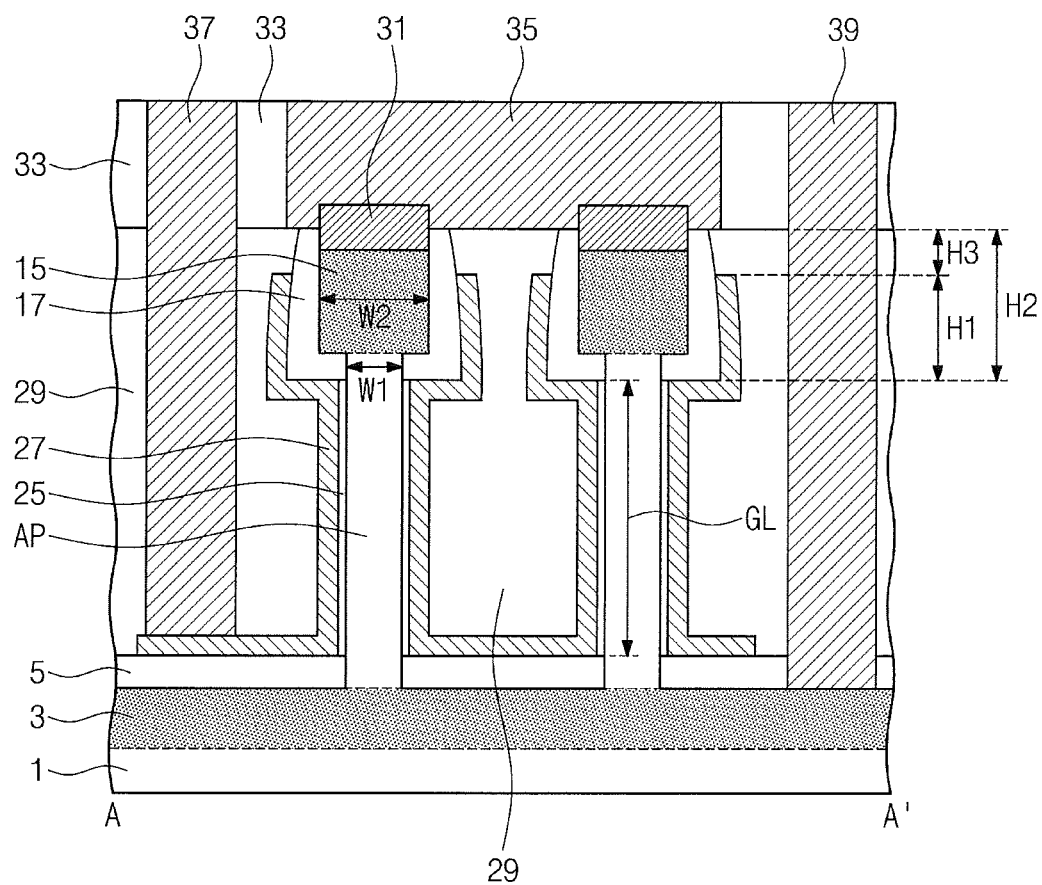
FIG. 2 is a cross-sectional view taken along a line A-A' of FIG. 1.

FIG. 1 is a plan view illustrating a semiconductor device according to some embodiments of the inventive concepts. FIG. 2 is a cross-sectional view taken along a line A-A' of FIG. 1. Referring to FIGS. 1 and 2, active pillars AP may protrude from a semiconductor substrate 1, for example, a silicon substrate, a germanium substrate, a silicon-germanium substrate, a II-VI group compound semiconductor substrate, or a III-V group compound semiconductor substrate. The active pillars AP may be formed from the semiconductor substrate 1. A first source/drain region 3 may be disposed in the semiconductor substrate 1 under the active pillars AP. The first source/drain region 3 may be doped with N-type or P-type dopants. The first source/drain region 3 may overlap with a plurality of the active pillars AP when viewed in a plan view. A first insulating layer 5 may be disposed on the semiconductor substrate 1 around the active pillars AP. The first insulating layer 5 may be thicker than a gate insulating layer 25. The first insulating layer 5 may be formed of, for example, a single layer of a nitride layer or a double layer of an oxide layer and a nitride layer. In the event that the first insulating layer 5 is formed of the double layer, the oxide layer of the first insulating layer 5 may relax stress between the nitride layer and the semiconductor substrate 1. The nitride layer may act as an etch stop layer during a patterning process described below.

Respective second source/drain regions 15 may be disposed on top ends of the active pillars AP. The second source/drain regions 15 may be doped with N-type or P-type dopants. The second source/drain regions 15 may have the same conductivity type (e.g., the N-type or P-type) as the first source/drain region 3. A first width W1 of an active pillar AP may be smaller than a second width W2 of a second source/drain region 15 disposed thereon, such that the second source/drain region 15 may bilaterally protrude beyond sidewalls of the active pillar AP. A spacer 17 may cover a bottom surface of the lateral protrusion of the second source/drain region 15. The spacer 17 may be in contact with a sidewall of an upper portion of the active pillar AP. The spacer 17 may extend to contact a sidewall of the second source/drain region 15. An ohmic layer 31 may be formed on the second source/drain region 15. The ohmic layer 31 may be, for example, a metal silicide layer. The spacer 17 may cover a portion of a sidewall of the ohmic layer 31. The spacer 17 may be formed of, for example, a silicon nitride layer.

A gate electrode 27 may surround a sidewall of the active pillar AP. The gate insulating layer 25 may be disposed between the active pillar AP and the gate electrode 27. The gate electrode 27 may cover portions of a bottom surface and a sidewall of the spacer 17. The gate electrode 27 may also extend to partially cover a top surface of the first insulating layer 5. In the illustrated embodiments, the gate electrode 27 may extend to cover a sidewall of a neighboring active pillar AP. In some embodiments, the gate electrode 27 may include a metal layer.

A second insulating layer 29 may fill a space between the active pillars AP. The second insulating layer 29 may cover a sidewall of an upper portion of the spacer 17, the gate electrode 27, and the first insulating layer 5. A top surface of the second insulating layer 29 may be substantially coplanar with a top surface of the spacer 17. A third insulating layer 33 may cover the second insulating layer 29. An upper electrode 35 may be disposed in the third insulating layer 33 and may be electrically connected to the second source/drain region 15 through the ohmic layer 31. The upper electrode 35 may be spaced apart from the gate electrode 27. A first vertical length H1 from the bottom surface of the spacer 17 to a top surface of the gate electrode 27 may be equal to or greater than 0 (zero). A second vertical length H2 from the bottom surface of the spacer 17 to a bottom surface of the upper electrode 35 may be greater than the first vertical length H1. In other words, a third vertical length H3 from the top surface of the gate electrode 27 to the bottom surface of the upper electrode 35 may be greater than 0 (zero), and thus the gate electrode 27 may be spaced apart from the upper electrode 35.

A gate electrode contact 37 may penetrate the third insulating layer 33 and the second insulating layer 29 so as to contact the portion of the gate electrode 27 that covers the first insulating layer 5. A lower electrode contact 39 may penetrate the third insulating layer 33, the second insulating layer 29, and the first insulating layer 5 so as to contact the first source/drain region 3.

The first and second source/drain regions 3 and 15 and the gate electrode 27 surrounding the active pillar AP may serve as components of a vertical field effect transistor. In the illustrated embodiments, one gate electrode 27 may surround two adjacent active pillars AP. However, embodiments of the inventive concepts are not limited thereto. In certain embodiments, one gate electrode 27 may surround a single active pillar AP or may surround three or more active pillars AP. In some embodiments, the first and second source/drain regions 3 and 15 may partially extend into the active pillar AP. That is, the dopants of the first and second source/drain regions 3 and 15 may permeate into portions of the active pillar AP, which are adjacent to the first and second source/drain regions 3 and 15.

In such vertical field effect transistors, an effective gate length GL may not be a vertical length of the gate electrode 27 but may correspond to a vertical length from the top surface of the first insulating layer 5 to the bottom surface of the spacer 17. In other words, the effective gate length GL may be determined at least in part by the spacer 17. The gate electrode 27 may include a gate portion which is adjacent to the active pillar AP to function as a substantial gate electrode in one vertical field effect transistor. The effective gate length GL means a length of the gate portion of the gate electrode 27.

In contrast, if the spacer 17 were not present and a shorter gate electrode were formed that only covers a portion of the active pillar AP, significant variance in effective gate lengths of gate electrodes disposed at different positions may occur due to variance in etch rates (e.g., a loading effect) in etching a metal layer from which the gate electrodes are formed. However, according to some embodiments of the inventive concepts, a location of a bottom surface of the spacer 17 may control the effective gate length, and variance in etch rates when etching the insulating layer used to form the spacer 17 may be much less than the variance of etch rates caused when etching a metal layer to form gate electrodes. Thus, variance in the effective gate lengths of the transistors may be reduced, which can reduce or minimize variance in threshold voltages of the vertical field effect transistors. In addition, since the width of the second source/drain region 15 may be greater than that of the active pillar AP, a resistance "on" resistance may be achieved. Furthermore, since the gate electrode 27 surrounds the active pillar AP, channel current may be increased to reduce a short channel effect.

Figure 3:
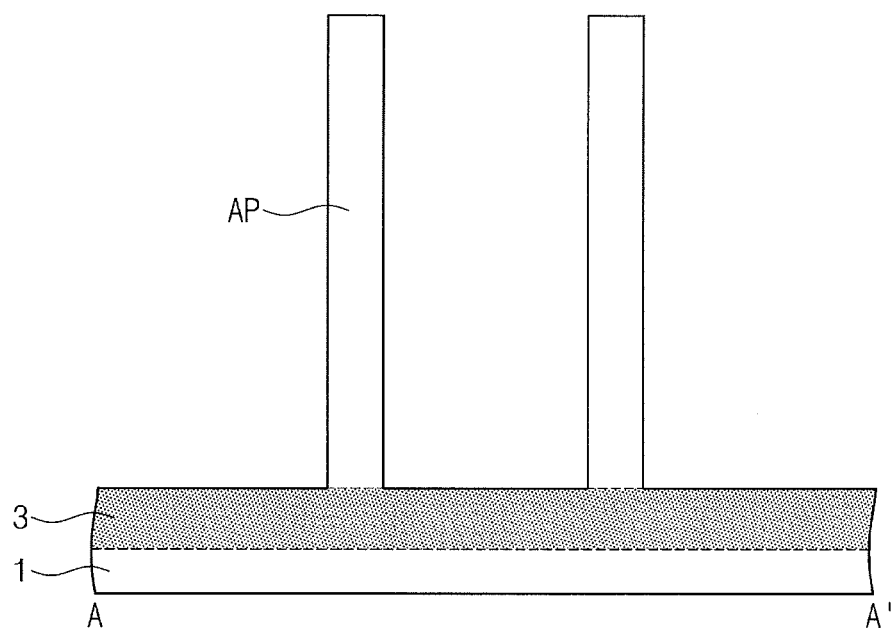
FIGS. 3 to 15 are cross-sectional views illustrating operations for fabricating semiconductor devices according to further embodiments.

FIGS. 3 to 15 are cross-sectional views illustrating operations for fabricating a semiconductor device having the cross section of FIG. 2 according to some embodiments. Referring to FIG. 3, a semiconductor substrate 1 may be etched using a mask pattern (not shown) as an etch mask to form a plurality of active pillars AP protruding from a surface of the semiconductor substrate 1. A protective layer (not shown) may be conformally formed on the semiconductor substrate 1 having the active pillars AP. An ion implantation process may be performed to inject dopants into the semiconductor substrate 1, followed by an annealing process to diffuse and/or activate the dopants injected in the semiconductor substrate 1 and thereby forte a first source/drain region 3.

Figure 4:
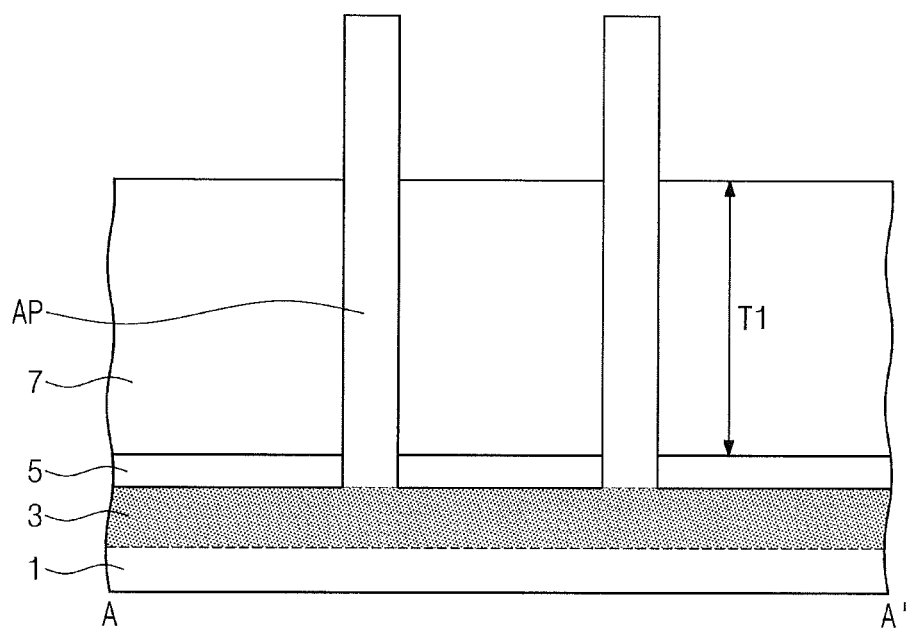

Referring to FIG. 4, the mask pattern (not shown) and the protective layer (not shown) may be removed, and then, a first insulating layer 5 may be formed on the semiconductor substrate 1 to cover the active pillars AP. For example, the first insulating layer 5 may include a silicon nitride layer or a combination of a silicon oxide layer and a silicon nitride layer which are sequentially formed. An etch-back process may be performed with respect to the first insulating layer 5 to expose sidewalls of the active pillars AP. A portion of the first insulating layer 5, which has a predetermined thickness, may remain on the semiconductor substrate 1 after the etch-back process. A first sacrificial insulating layer 7 may be formed on the semiconductor substrate 1 to cover the active pillars AP. In some embodiments, the first sacrificial insulating layer 7 may be formed of a material having an etch selectivity with respect to the first insulating layer 5 and the active pillars AP. For example, the first sacrificial insulating layer 7 may be formed of a silicon oxide layer. An etch-back process may be performed with respect to the first sacrificial insulating layer 7 to expose top surfaces and upper portions of the sidewalls of the active pillars AP. A portion of the first sacrificial insulating layer 7 may remain to fill a space between lower portions of the sidewalls of the active pillars AP. A thickness T1 of the remaining portion of the first sacrificial insulating layer 7 may be approximately equal to an effective gate length (GL of FIG. 2) of a vertical field effect transistor to be finally formed later. A height of a top surface of the first sacrificial insulating layer 7 etched by the etch-back process may correspond to a height of a bottom surface of a spacer 17 to be formed subsequently. As noted above, a variance of etch rates caused in the etch-back process of etching the first sacrificial insulating layer 7 may be very small and may be in a range of about a fifth to about a tenth of a variance of etch rates caused in a process of etching a metal layer.

Figure 5:
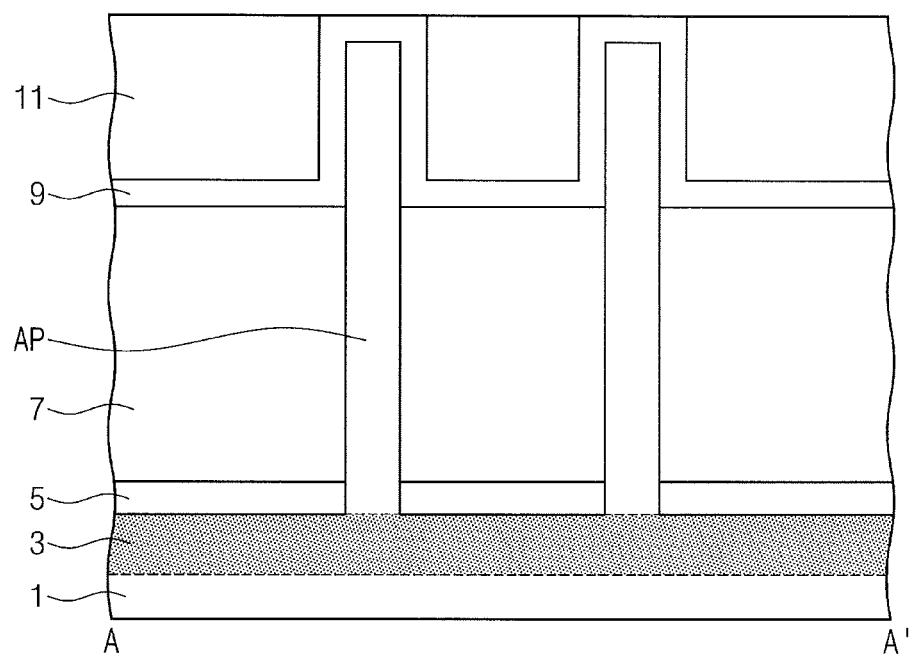

Referring to FIG. 5, a second sacrificial insulating layer 9 may be conformally formed on the semiconductor substrate 1 in the state of FIG. 4 so as to cover the top surface of the first sacrificial insulating layer 7 and the exposed top surfaces and sidewalls of the active pillars AP. The second sacrificial insulating layer 9 may include a material having an etch selectivity with respect to the first sacrificial insulating layer 7 and the active pillars AP. For example, the second sacrificial insulating layer 9 may include a silicon nitride layer. A third sacrificial insulating layer 11 may be formed on the second sacrificial insulating layer 9, and a planarization process (e.g., an etch-back process or a chemical mechanical polishing (CMP) process) may be performed with respect to the third sacrificial insulating layer 11 to expose a top surface of the second sacrificial insulating layer 9 disposed on the top surface of the active pillar AP. The third sacrificial insulating layer 11 may include, for example, a silicon oxide layer.

Figure 6:
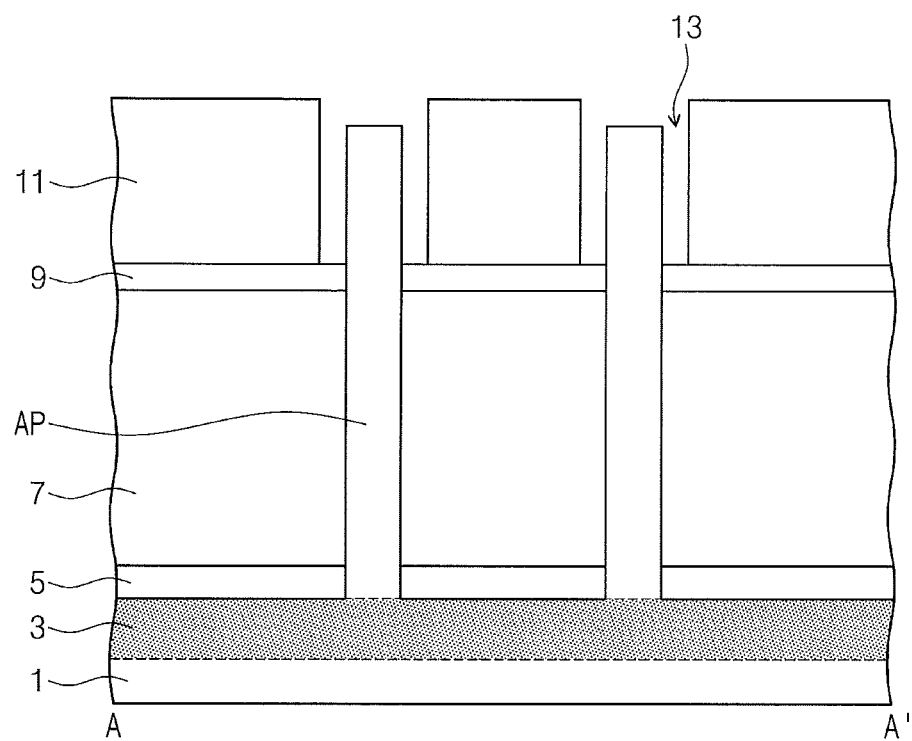

Referring to FIG. 6, an anisotropic etching process may be performed with respect to the exposed portion of the second sacrificial insulating layer 9 to remove the second sacrificial insulating layer 9 disposed between the third sacrificial insulating layer 11 and the active pillar AP but to leave the second sacrificial insulating layer 9 disposed between the third sacrificial insulating layer 11 and the first sacrificial insulating layer 7. Thus, the sidewalls of the active pillars AP and the third sacrificial insulating layer 11 may be exposed, and a gap 13 may be formed therebetween.

Figure 7:
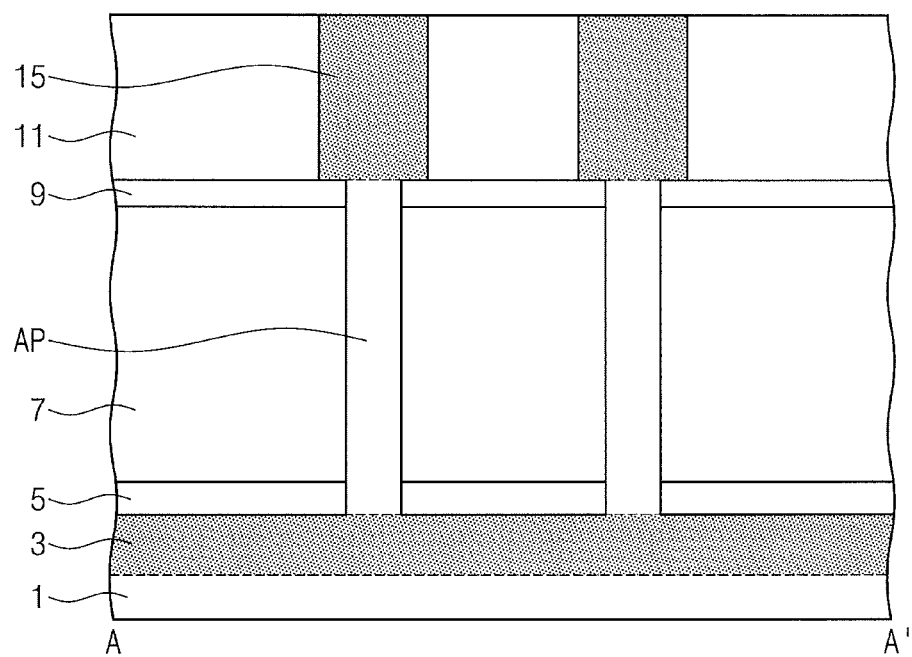

Referring to FIG. 7, a selective epitaxial growth (SEG) process may be performed to grow an epitaxial layer from the exposed surface of the active pillar AP. The epitaxial layer may fill the gap 13. In certain embodiments, the epitaxial layer may protrude outside the gap 13. The portion of the epitaxial layer that protrudes outside the gap 13 may be removed by an etch-back process. Dopants may be injected into the epitaxial layer in the gap 13 by an ion implantation process, thereby forming a second source/drain region 15. In some embodiments, dopants may be provided in-situ during the growth of the epitaxial layer to form the second source/drain region 15. A width of the second source/drain region 15 may be greater than a width of the active pillar AP.

Figure 8:
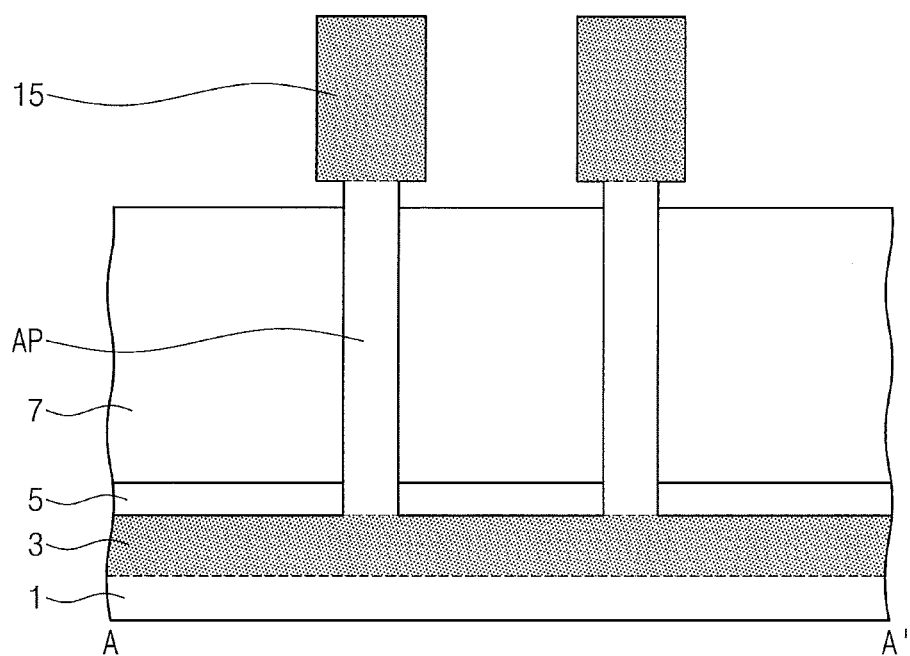

Referring to FIG. 8, the third sacrificial insulating layer 11 and the second sacrificial insulating layer 9 may be removed to expose a surface of the second source/drain region 15, a sidewall of an upper portion of the active pillar AP, and the top surface of the first sacrificial insulating layer 7. A bottom surface of the second source/drain region 15 may be spaced apart from the top surface of the first sacrificial insulating layer 7.

Figure 9:
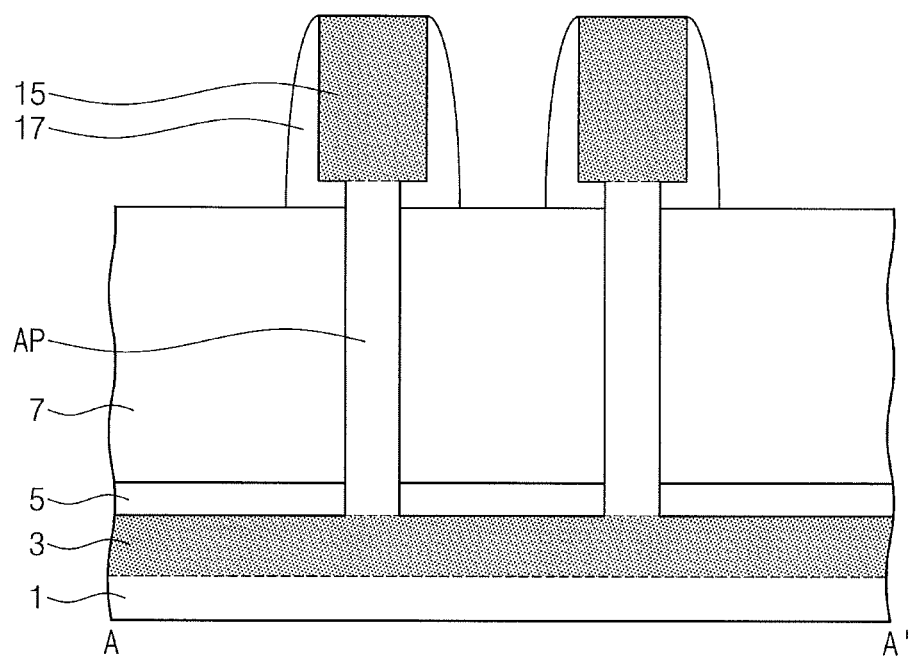

Referring to FIG. 9, a spacer layer may be conformally formed on the structure of FIG. 8, and an anisotropic etching process may be performed with respect to the spacer layer to form a spacer 17 on a sidewall of the second source/drain region 15. The spacer 17 may be in contact with the bottom surface of the second source/drain region 15 and the exposed sidewall of the upper portion of the active pillar AP. The spacer 17 may include, for example, a silicon nitride layer. A height of a bottom surface of the spacer 17 may be approximately equal to the height of the top surface of the first sacrificial insulating layer 7.

Figure 10:
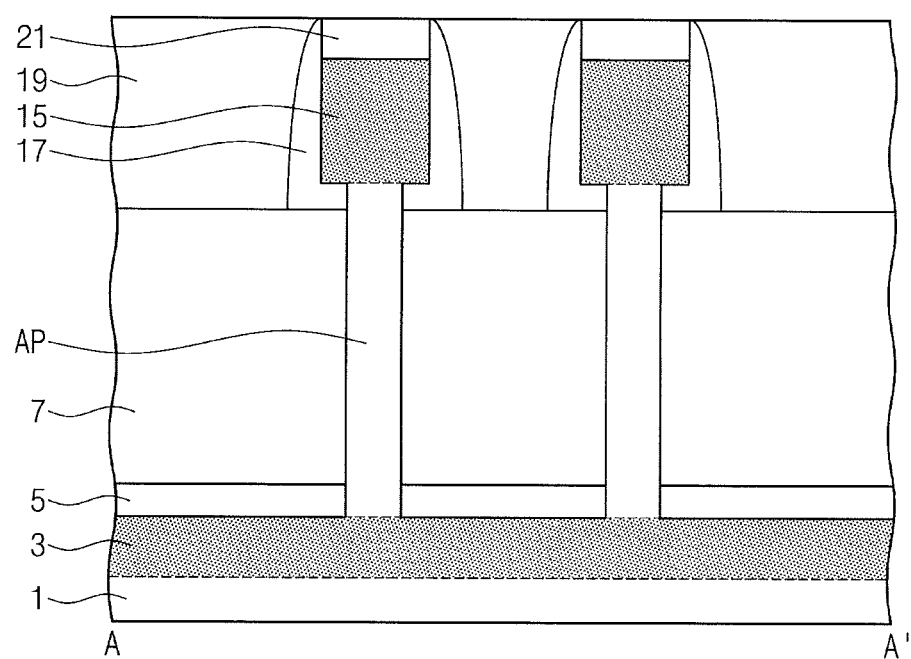

Referring to FIG. 10, a fourth sacrificial insulating layer 19 may be foiled on the structure of FIG. 9, and a planarization process may be performed to expose top surfaces of the second source/drain regions 15. The remaining portion of the planarized fourth sacrificial insulating layer 19 may fill a space between the second source/drain regions 15. In some embodiments, the fourth sacrificial insulating layer 19 may be formed from the same material as the first sacrificial insulating layer 7. The fourth sacrificial insulating layer 19 may include, for example, a silicon oxide layer. The exposed top surfaces of the second source/drain regions 15 may be recessed, and a capping layer may be formed to fill the recesses above the second source/drain regions 15. The capping layer may be planarized to form respective capping patterns 21 on the second source/drain regions 15. The capping patterns 21 may be formed from the same material as the spacer 17. The capping patterns 21 may include, for example, a silicon nitride layer.

Figure 11:
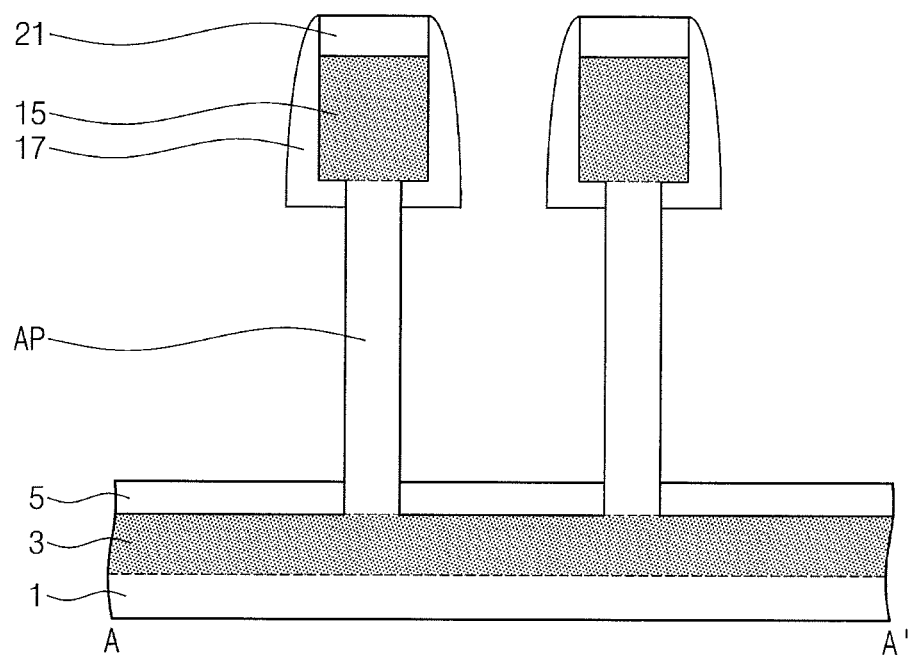

Referring to FIG. 11, the fourth sacrificial insulating layer 19 and the first sacrificial insulating layer 7 may be removed to expose a top surface of the first insulating layer 5, the sidewalls of the active pillars AP, the bottom surfaces and sidewalls of the spacers 17, and top surfaces of the capping patterns 21.

Figure 12:
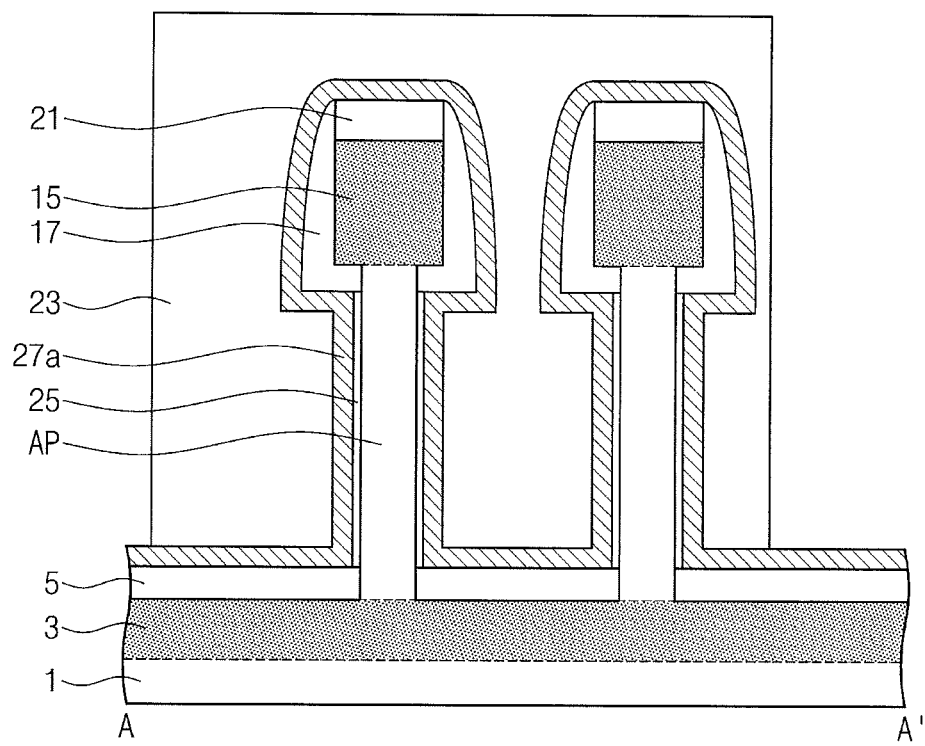

Referring to FIG. 12, a gate insulating layer 25 may be formed on the exposed sidewall of each of the active pillars AP. If the gate insulating layer 25 is formed by a thermal oxidation process, the gate insulating layer 25 may be limited to the exposed sidewall of the active pillar AP. A gate electrode layer 27a may be conformally formed on the gate insulating layer 25 and adjacent surfaces, and a mask pattern 23 defining a shape of a gate electrode may be formed on the gate electrode layer 27a. The mask pattern 23 may be formed from a material having an etch selectivity with respect to the capping pattern 21, the spacer 17, and the gate electrode layer 27a. For example, the mask pattern 23 may include a silicon oxide layer. The mask pattern 23 may expose a portion of the gate electrode layer 27a disposed on the first insulating layer 5.

Figure 13:
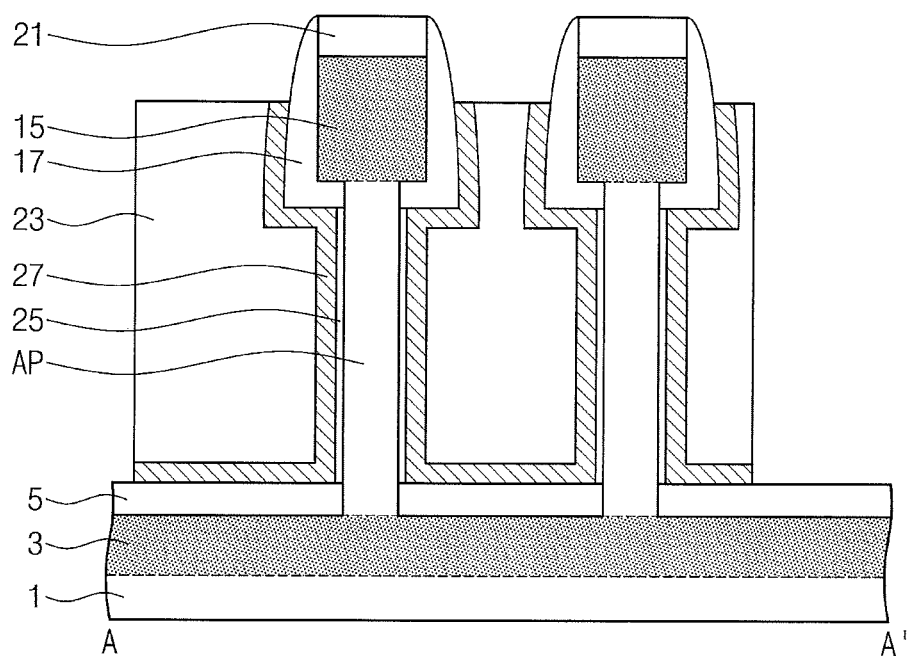

Referring to FIG. 13, an upper portion of the mask pattern 23 may be etched back to expose an upper portion of the gate electrode layer 27a. An anisotropic etching process may be performed with respect to the exposed gate electrode layer 27a to remove the exposed upper portion of the gate electrode layer 27a and the exposed portion of the gate electrode layer 27a disposed on the first insulating layer 5. In this manner, a gate electrode 27 may be formed.

Figure 14:
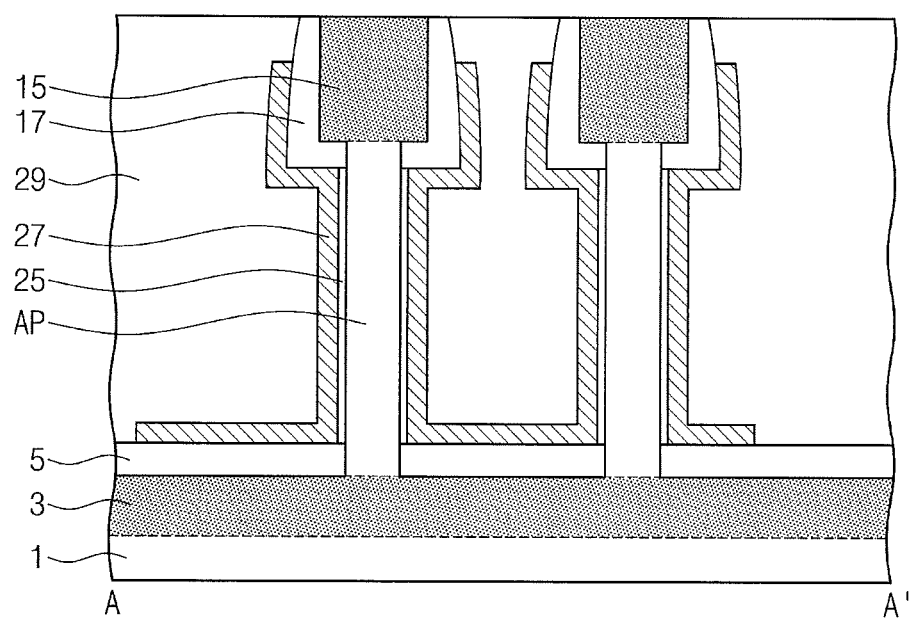

Referring to FIG. 14, the mask pattern 23 may be removed to expose a surface of the gate electrode 27. A second insulating layer 29 may be formed to cover the capping patterns 21, the spacers 17, and the gate electrode 27. A planarization process (e.g., an etch-back process or a CMP process) may be performed to remove portions of the second insulating layer 29, the capping patterns 21, and portions of the spacers 17 such that the second source/drain regions 15 are exposed.

Figure 15:
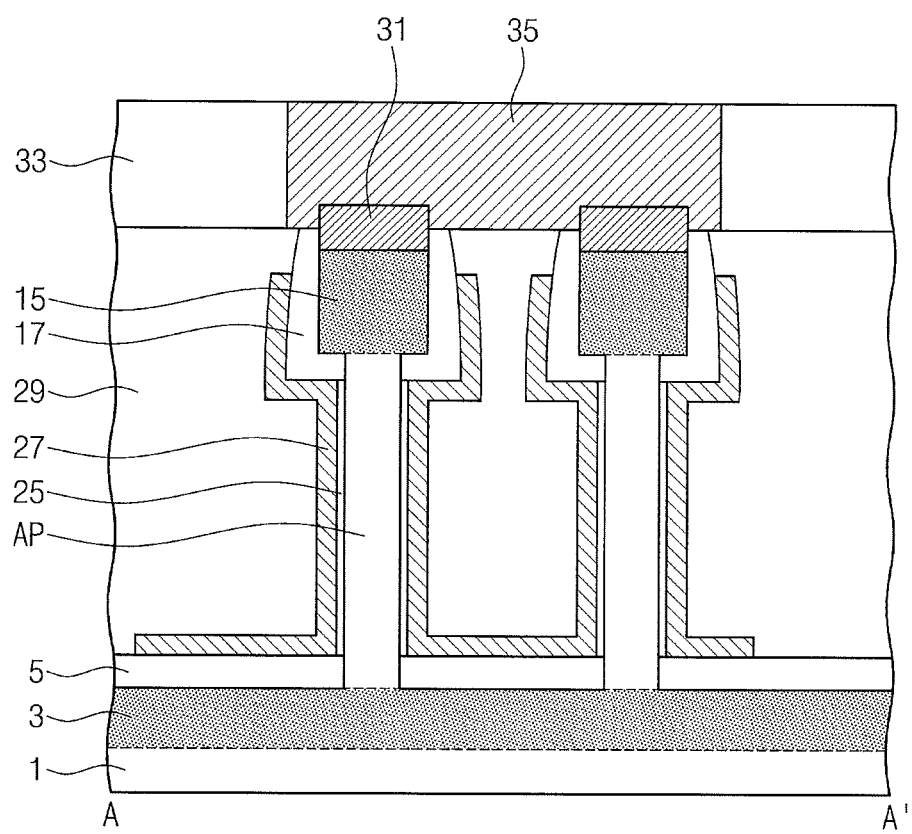

Referring to FIG. 15, a third insulating layer 33 may be formed on the second insulating layer 29. The third insulating layer 33 may be patterned to form an opening exposing the second source/drain regions 15. A silicidation process may be performed to convert a portion of each of the second source/drain regions 15 into a metal silicide ohmic layer 31. Subsequently, the opening may be filled with a conductive layer, which may be planarized to form an upper electrode 35. As illustrated in FIG. 2, a gate electrode contact 37 and a lower electrode contact 39 may be subsequently formed.

As described above, since the effective gate length GL is determined by the thickness T1 of the first sacrificial insulating layer 7, the dispersion of the effective gate lengths may be reduced.

Figure 16:
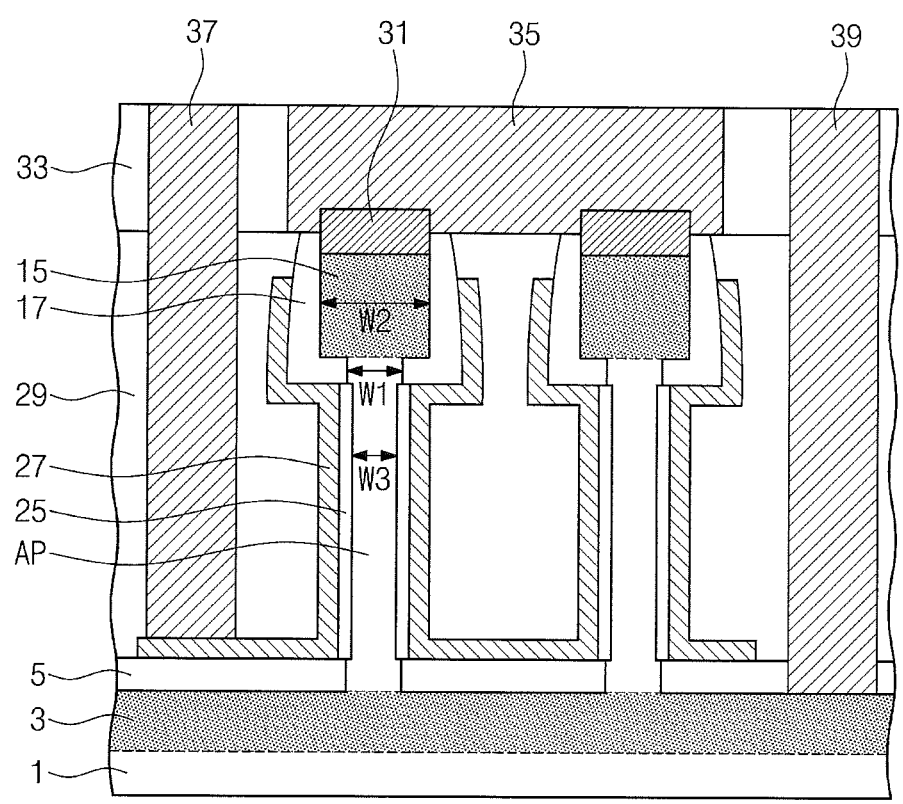
FIGS. 16 to 18 are cross-sectional views illustrating semiconductor devices according to still further embodiments of the inventive concepts.
Figure 17:
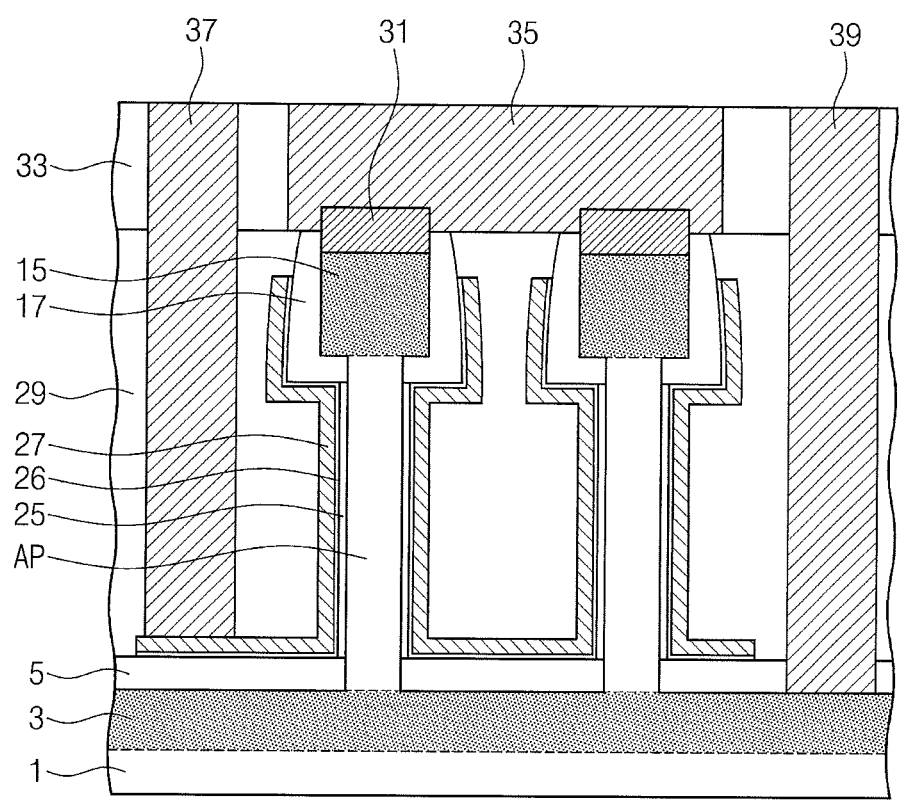
Figure 18:
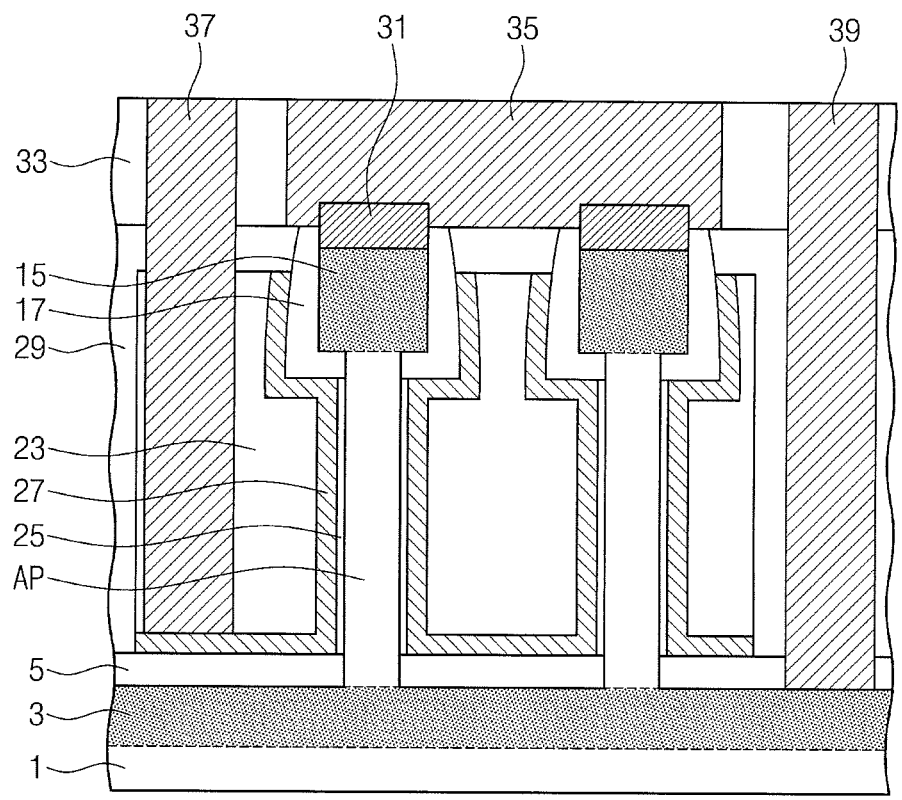

FIGS. 16 to 18 are cross-sectional views illustrating semiconductor devices according to some embodiments of the inventive concepts.

Referring to FIG. 16, in the event that the gate insulating layer 25 is thickly formed by the thermal oxidation process, a width of the active pillar AP may be reduced because a portion of the active pillar AP is oxidized to form the gate insulating layer 25. Thus, a third width W3 of the active pillar AP according to the embodiments illustrated in FIGS. 16-18 may be less than the first width W1 of the active pillar AP illustrated in FIG. 2. Other components of the semiconductor device of FIG. 16 may be the same or similar as corresponding components of the semiconductor device described with reference to FIG. 2, with like items indicated by like reference designators.

Referring to FIG. 17, a semiconductor device according to the some embodiments may further include a high-k dielectric layer 26. The high-k dielectric layer 26 may include a material having a higher dielectric constant than silicon oxide. For example, the high-k dielectric layer 26 may include a metal oxide layer. The high-k dielectric layer 26 may be formed by a deposition process. The high-k dielectric layer 26 may be disposed between the gate insulating layer 25 and the gate electrode 27 and between the spacer 17 and the gate electrode 27. The high-k dielectric layer 26 may act as a gate insulating layer and may be used to adjust the threshold voltage of the vertical field effect transistor. Other components of the semiconductor device of FIG. 17 may be the same or similar as corresponding components of the semiconductor device described with reference to FIG. 2, with like items indicated by like reference designators.

Referring to FIG. 18, a semiconductor device according to the some embodiments may include the mask pattern 23 illustrated in FIG. 13, which, unlike discussed above with reference to FIG. 14, is not removed. Similar subsequent processes as described above may be performed to fabricate the semiconductor device, except, since the process of removing the mask pattern 23 is omitted, the number of the fabricating processes may be reduced to simplify the fabricating processes. Other components of the semiconductor device of FIG. 18 may be the same or similar as corresponding components of the semiconductor device described with reference to FIG. 2, with like items indicated by like reference designators.

In semiconductor devices according to some embodiments of the inventive concepts, a spacer may cover at least the bottom surface of a source/drain region disposed on an active pillar, and a gate electrode may cover a sidewall of the active pillar and at least the bottom surface of the spacer. The effective gate lengths of vertical field effect transistors thus formed may be substantially uniform due to the use of the spacers. This can provide greater uniformity in the threshold voltages of the vertical field effect transistors.

In methods of fabricating semiconductor devices according to some embodiments of the inventive concepts, an effective gate length of a transistor to be formed may be determined by the thickness of the etched-back sacrificial insulating layer. The process of etching the insulating layer may be more easily controlled than a process for etching a metal layer for forming the gate electrode. Therefore, variance of etch rates in the process of etching the insulating layer may be much less than the variance of etch rates in the process of etching the metal layer. Thus, variance in the effective gate lengths of the transistors may be limited.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A semiconductor device comprising:
an active pillar on a substrate;
a first source/drain region at a top end of the active pillar and having a greater width than the active pillar;
a first insulating layer on a sidewall of the active pillar;
a second insulating layer on at least a bottom surface of the first source/drain region;
a gate electrode on the first insulating layer and the second insulating layer and extending onto a sidewall of the first source/drain region; and
a second source/drain region in the substrate at a bottom end of the active pillar.

2. The semiconductor device of claim 1, wherein the second insulating layer extends onto a sidewall of the first source/drain region.

3. The semiconductor device of claim 1, wherein the gate electrode extends onto the substrate and wherein the semiconductor device further comprises a third insulating layer disposed between the gate electrode and the substrate and thicker than the second insulating layer.

4. The semiconductor device of claim 3, wherein the third insulating layer comprises an oxide layer and a nitride layer.

5. The semiconductor device of claim 1, further comprising an upper electrode on and electrically connected to the first source/drain region and spaced apart from the gate electrode.

6. The semiconductor device of claim 5, wherein the active pillar includes a plurality of active pillars and the first source/drain region includes a plurality of first source/drain regions respectively disposed on the active pillars and wherein the upper electrode contacts the plurality of first source/drain regions.

7. The semiconductor device of claim 5, wherein the active pillar includes a plurality of active pillars and the first source/drain region includes a plurality of first source/drain regions respectively disposed on the active pillars, and wherein the semiconductor device further comprises:
a mask pattern between the active pillars; and
a third insulating layer on a top surface and a sidewall of the mask pattern, filling a space between the first source/drain regions, and in contact with the upper electrode.

8. The semiconductor device of claim 5, wherein the active pillar includes a plurality of active pillars and the first source/drain region includes a plurality of first source/drain regions respectively disposed on the active pillars, and wherein the semiconductor device further comprises:

a third insulating layer disposed between the active pillars and between the first source/drain regions and in contact with the upper electrode; and a fourth insulating layer on the third insulating layer and in contact with a sidewall of the upper electrode.

9. The semiconductor device of claim 1, further comprising a high-k dielectric layer between the gate electrode and the first and second insulating layers.

10. The semiconductor device of claim 1, wherein the active pillar includes a plurality of active pillars and wherein the gate electrode extends on to sidewalls of the plurality of active pillars.

11. A semiconductor device comprising:
a semiconductor pillar;
a source/drain region adjoining an end of the semiconductor pillar and having a width greater than a width of the semiconductor pillar;
a first insulating layer on a sidewall of the semiconductor pillar;
a second insulating layer on a surface of the source/drain region adjacent the sidewall of the semiconductor pillar; and
a gate electrode on the first and second insulating layers and extending onto a sidewall of the source/drain region.

12. The semiconductor device of claim 11, wherein the second insulating layer extends onto a sidewall of the source/drain region.

13. The semiconductor device of claim 11, further comprising a third insulating layer interposed between the gate electrode and the first and second insulating layers.

14. The semiconductor device of claim 13, wherein the third insulating layer comprises a metal oxide layer.

* * * * *